(12) United States Patent
Yang

(10) Patent No.: US 7,470,943 B2
(45) Date of Patent: Dec. 30, 2008

(54) HIGH PERFORMANCE MOSFET COMPRISING A STRESSED GATE METAL SILICIDE LAYER AND METHOD OF FABRICATING THE SAME

(75) Inventor: Haining S. Yang, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 324 days.

(21) Appl. No.: 11/208,985

(22) Filed: Aug. 22, 2005

(65) Prior Publication Data

US 2007/0040225 A1    Feb. 22, 2007

(51) Int. Cl.
*H01L 31/112* (2006.01)
(52) U.S. Cl. .................................... 257/288
(58) Field of Classification Search ............ 438/296; 257/407, 194, 288
See application file for complete search history.

(56) References Cited

U.S. PATENT DOCUMENTS

| | | | |
|---|---|---|---|
| 5,731,239 A * | 3/1998 | Wong et al. ............... | 438/296 |
| 5,952,701 A * | 9/1999 | Bulucea et al. ............. | 257/407 |
| 6,420,766 B1 | 7/2002 | Brown et al. | |
| 6,914,303 B2 | 7/2005 | Doris et al. | |
| 6,977,194 B2 | 12/2005 | Belyansky et al. | |
| 2003/0040158 A1 | 2/2003 | Saitoh | |
| 2005/0082616 A1 | 4/2005 | Chen et al. | |
| 2005/0093021 A1* | 5/2005 | Ouyang et al. ............. | 257/194 |
| 2005/0093059 A1 | 5/2005 | Belyansky et al. | |

* cited by examiner

*Primary Examiner*—Carl Whitehead, Jr.
*Assistant Examiner*—Monica D Harrison
(74) *Attorney, Agent, or Firm*—Scully, Scott, Murphy & Presser, P.C.; Joseph P. Abate, Esq.

(57) ABSTRACT

The present invention relates to a semiconductor device that comprises at least one field effect transistor (FET) containing a source region, a drain region, a channel region, a gate dielectric layer, a gate electrode, and one or more gate sidewall spacers. The gate electrode of such an FET contains an intrinsically stressed gate metal silicide layer, which is laterally confined by one or more gate sidewall spacers and is arranged and constructed for creating stress in the channel region of the FET. Preferably, the semiconductor device comprises at least one p-channel FET, and more preferably, the p-channel FET has a gate electrode with an intrinsically stressed gate metal silicide layer that is laterally confined by one or more gate sidewall spacers and is arranged and constructed for creating compressive stress in the p-channel of the FET.

4 Claims, 6 Drawing Sheets

US 7,470,943 B2

HIGH PERFORMANCE MOSFET COMPRISING A STRESSED GATE METAL SILICIDE LAYER AND METHOD OF FABRICATING THE SAME

FIELD OF THE INVENTION

This invention generally relates to a semiconductor device containing at least one high performance field effect transistor (FET). More specifically, the present invention relates to a high performance metal-oxide-semiconductor field effect transistor (MOSFET) containing a stressed gate metal silicide layer, and methods for fabricating the high performance MOSFET.

BACKGROUND OF THE INVENTION

Integrated circuit elements, such as transistors, capacitors and the like, have been drastically reduced in size and increased in density and proximity, which in turn reduce the signal propagation path length and the signal propagation time. However, the material properties and the physical effects by which transistors and other elements function are inevitably compromised as the sizes of integrated circuit elements reduce.

Many improved designs have therefore been provided in order to maintain suitable levels of performance of these elements. For example, lightly doped drain (LDD) structures (generally referred to as extension implants), halo implants and graded impurity profiles have been employed in field effect transistors (FETs) to counteract short channel and punch-through effects and the like. Reduction in device scale has also required operation at reduced voltages to maintain adequate performance without causing damage to the devices, even though operating margins may be reduced.

A principal factor that affects the performance of field effect transistors is the carrier mobility, which determines the amount of current or charge that may flow (as electrons or holes) through a doped semiconductor channel under a specific gate voltage. Reduced carrier mobility in an FET reduces not only the switching speed/skew rate of a given transistor, but also reduces the difference between "on" resistance to "off" resistance. This latter effect increases susceptibility to noise and reduces the number of and/or the speed at which downstream transistor gates can be driven.

It has been shown that mechanical stress in the channel region of an FET can increase or decrease carrier mobility significantly, depending on the stress type (e.g., tensile or compressive stress) and the carrier type (e.g., electron or hole). Typically, tensile stress in the transistor channel region increases channel electron mobility, but decreases channel hole mobility; on the other hand, compressive stress in such a channel region increases channel hole mobility, but decreases channel electron mobility.

In this regard, numerous structures and materials have been proposed for inducing tensile or compressive stress in the FET channel region, such as the use of an underlying SiGe layer for imparting stress from the bottom of the FET channel layer, and/or use of shallow trench isolation (STI) structures, gate spacers, $Si_3N_4$ etch-stop layers for imparting longitudinal stress from the sides of the FET channel layer.

However, there are issues, well known to those skilled in the art, regarding the underlying SiGe layer, including formation of dislocation defects that severely impact yield, along with increased manufacturing cost and processing complexity. The STI approach is less costly, but is not self-aligned to the gate and has external resistance (RX) size sensitivity. By using $Si_3N_4$ etch-stop layers, on the other hand, gain is limited by the space between two closely placed gates. As transistor scales, the space becomes smaller and thickness of Si3N4 has to be reduced accordingly, resulting in smaller stress effect.

Therefore, there is a continuing need for structures and methods that can provide significantly high stresses for forming high performance FET devices at reduced costs and processing complexity.

SUMMARY OF THE INVENTION

The present invention advantageously employs an intrinsically stressed gate metal silicide layer to apply desired stresses to respective MOSFET components (i.e., compressive stress to p-MOSFET channel and tensile stress to n-MOSFET channel).

In one aspect, the present invention relates to a semiconductor device that is located in a semiconductor substrate. The semiconductor device comprises at least one field effect transistor (FET) containing a source region, a drain region, a channel region, a gate dielectric layer, a gate electrode, and one or more gate sidewall spacers, wherein the gate electrode comprises an intrinsically stressed gate metal silicide layer, which is laterally confined by the one or more gate sidewall spacers and is arranged and constructed for creating stress in the channel region of the FET.

The term "intrinsically stressed" or "intrinsic stress" as used herein refers to a stress or presence of a stress, either compressive or tensile, which is developed during preparation of a structure and can therefore be retained in the structure without external force, in contrast to an extrinsic stress that is applied to a structure by an external force and can only be maintained by the external force.

In a preferred embodiment, the FET is a p-channel FET (p-FET). More preferably, the gate electrode of the p-FET contains an intrinsically stressed (more preferably, tensilely stressed) gate metal silicide layer that is laterally confined by one or more gate sidewall spacers, for creating compressive stress in a channel region of the p-FET.

Further, the semiconductor device of the present invention may comprise an n-channel FET (n-FET) in addition to the p-FET. In one embodiment, the n-FET may comprise a gate electrode having a gate metal silicide layer that protrudes above one or more gate sidewall spacers. Such a protruding gate metal silicide creates little or no stress in a channel region of the n-FET. In an alternative embodiment, the n-FET may comprise a gate electrode having an intrinsically stressed (preferably compressively stressed) gate metal silicide layer that is laterally confined by one or more gate sidewall spacers for creating tensile stress in a channel region of the n-FET.

The term "tensilely stressed" or "compressively stressed" as used herein typically refers to a structure characterized by an intrinsic stress, either compressive or tensile, unless specified otherwise.

In another aspect, the present invention relates to a method for fabricating a semiconductor device, comprising:

forming at least one field effect transistor (FET) in a semiconductor substrate, which comprises a source region, a drain region, a channel region, a gate dielectric layer, a gate electrode, and one or more gate sidewall spacers;

forming an intrinsically stressed metal suicide layer in a surface of the gate electrode, wherein the intrinsically stressed metal silicide layer is laterally confined by the gate sidewall spacers and is arranged and constructed for creating stress in the channel region of the FET.

In one embodiment of the present invention, the intrinsically stressed metal silicide layer is formed by a salicidation (i.e., self-aligned silicidation) process. As mentioned hereinabove, the FET preferably is a p-FET having a gate electrode with an intrinsically stressed gate metal silicide layer that is laterally confined by one or more gate sidewall spacers, for creating compressive stress in a channel region of the p-FET. More preferably, an n-FET is formed in addition to said p-FET. In this embodiment of the present invention, the n-FET may have a gate electrode with a gate metal silicide layer that is protruding above one or more gate sidewall spacers.

The p-FET and n-FET may be formed by:
forming at least one p-FET precursor structure with a recessed gate electrode and at least one n-FET precursor structure with an un-recessed gate electrode;
depositing a metal layer over the p-FET and n-FET precursor structures;
depositing a first and a second capping layers over the metal layer;
annealing the p-FET and n-FET precursor structures at an elevated temperature to form a first metal silicide layer in a surface of the recessed gate electrode of the p-FET precursor structure, and a second metal silicide layer in a surface of the unrecessed gate electrode of the n-FET precursor structure; and
removing unreacted metal, the first capping layer, and the second capping layer from the p-FET and the n-FET precursor structures to form said p-FET and n-FET.

Alternatively, the p-FET and n-FET may be formed by:
providing at least one p-FET precursor structure with a recessed gate electrode and at least one n-FET precursor structure with an un-recessed gate electrode;
depositing a metal layer over the p-FET and n-FET precursor structures;
depositing a first capping layer over the metal layer to cover both the p-FET and the n-FET precursor structures;
forming a patterned second capping layer over the first capping layer to selectively cover the p-FET precursor structure;
annealing the p-FET and n-FET precursor structures at an elevated temperature to form a first metal silicide layer in a surface of the recessed gate electrode of the p-FET precursor structure, and a second metal silicide layer in a surface of the unrecessed gate electrode of the n-FET precursor structure; and
removing unreacted metal, the first capping layer, and the patterned second capping layer from the p-FET and the n-FET precursor structures to form the p-FET and the n-FET.

Further, the p-FET and n-FET may be formed by:
providing at least one p-FET precursor structure with a recessed gate electrode and at least one n-FET precursor structure with an unrecessed gate electrode;
depositing a metal layer over the p-FET and n-FET precursor structures and a first capping layer over the metal layer to cover both the p-FET and the n-FET precursor structures;
annealing the p-FET and n-FET precursor structures at a first elevated temperature to form a first metal silicide layer in a surface of the recessed gate electrode of the p-FET precursor structure, and a second metal silicide layer in a surface of the unrecessed gate electrode of the n-FET precursor structure, wherein the first and second metal silicide layers have a first silicide phase;
removing unreacted metal and the first capping layer from the p-FET and n-FET precursor structures;
forming a patterned second capping layer to selectively cover the p-FET precursor structure;
annealing the p-FET and n-FET precursor structures at a second elevated temperature to convert the first and second metal silicide layers from the first silicide phase into a second, different silicide phase; and
removing the patterned second capping layer from the p-FET precursor structure, to form the p-FET and the n-FET.

Still further, the p-FET and n-FET may be formed by:
providing at least one p-FET precursor structure with a recessed gate electrode and at least one n-FET precursor structure with an unrecessed gate electrode;
depositing a metal layer over the p-FET and n-FET precursor structures and a first capping layer over the metal layer to cover both the p-FET and the n-FET precursor structures;
annealing the p-FET and n-FET precursor structures at a first elevated temperature to form a first metal silicide layer in a surface of the recessed gate electrode of the p-FET precursor structure, and a second metal silicide layer in a surface of the unrecessed gate electrode of the n-FET precursor structure, wherein the first and second metal silicide layers have a first silicide phase;
removing unreacted metal and the first capping layer from the p-FET and n-FET precursor structures;
forming a patterned second capping layer to selectively cover the p-FET precursor structure, wherein said patterned second capping layer is compressively stressed;
annealing said p-FET and n-FET precursor structures at a second elevated temperature to convert the first and second metal silicide layers from the first silicide phase into a second, different silicide phase; and
forming a patterned third capping layer to selectively cover the n-FET precursor structure, wherein the patterned third capping layer is tensilely stressed, forming the n-FET and the p-FET.

In a further aspect, the present invention relates to a semiconductor device located in a semiconductor substrate, wherein the semiconductor device comprises at least one p-channel field effect transistor (p-FET) containing an intrinsically stressed gate metal silicide layer that is laterally confined by one or more gate sidewall spacers and is arranged and constructed for creating compressive stress in a channel region of the p-FET, and at least one n-channel field effect transistor (n-FET) containing a gate metal silicide layer that protrudes above one or more gate sidewall spacers.

In yet another aspect, the present invention relates to a semiconductor device located in a semiconductor substrate, wherein the semiconductor device comprises at least one p-channel field effect transistor (p-FET) containing an intrinsically stressed gate metal silicide layer that is laterally confined by one or more gate sidewall spacers and is arranged and constructed for creating compressive stress in a channel region of the p-FET, and at least one n-channel field effect transistor (n-FET) containing a compressively stressed gate metal silicide layer that is laterally confined by one or more gate sidewall spacers and is arranged and constructed for creating tensile stress in a channel region of the n-FET.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1A:
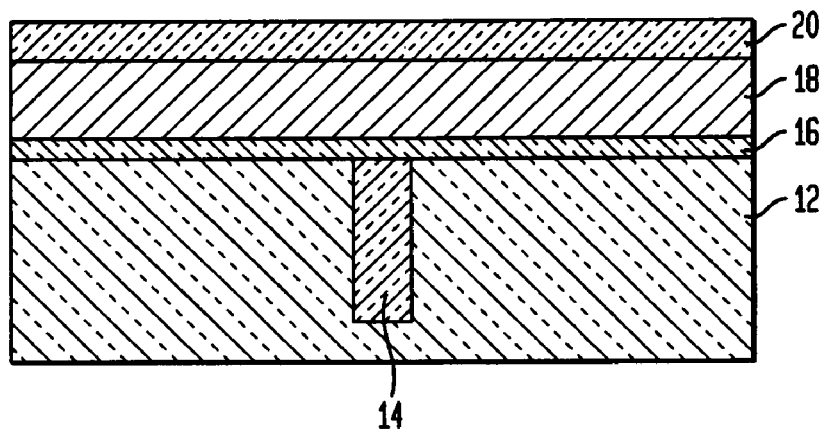
FIGS. 1A-1J illustrate the processing steps for forming an exemplary semiconductor device structure containing a p-FET with a "recessed" gate metal silicide layer that is tensilely stressed and an nFET with an "unrecessed" gate metal silicide layer, according to one embodiment of the present invention.

The following U.S. patent application publications are incorporated herein by reference in their entireties for all purposes:

U.S. Patent Application Publication No. 2003/0040158 published on Feb. 27, 2003 for "SEMICONDUCTOR DEVICE AND METHOD OF FABRICATING THE SAME";

U.S. Patent Application Publication No. 2005/0082616 published on Apr. 21, 2005 for "HIGH PERFORMANCE STRESS-ENHANCED MOSFETS USING SI:C AND SIGE EPITAXIAL SOURCE/DRAIN AND METHOD OF MANUFACTURE"; and U.S. Patent Application Publication No. 2005/0093059 published on May 5, 2005 for "STRUCTURE AND METHOD TO IMPROVE CHANNEL MOBILITY BY GATE ELECTRODE STRESS MODIFICATION."

As mentioned hereinabove, the present invention uses an intrinsically stressed gate metal silicide layer to create desired stress in the channel region of an FET (i.e., tensile stress in an n-channel and compressive stress in a p-channel).

The intrinsically stressed gate metal silicide layer is preferably formed by a salicidation process, which leads to volumetric contraction or expansion that, in turn, creates intrinsic tensile or compressive stress in the gate metal silicide layer. For example, salicidation of a cobalt- or nickel-containing gate metal layer typically results in volumetric contraction in the gate metal layer, which in turn creates a tensilely stressed gate metal silicide layer. High tensile stress (from about 1 GPa to about 1.5 GPa) can be formed and retained in the gate metal silicide layer if the metal silicide is encapsulated, by a rigid capping layer (such as a $Si_3N_4$ capping layer) and/or one or more gate sidewall spacers. The tensilely stressed gate metal silicide layer then creates compressive stress in an underlying channel layer of the FET, which can be advantageously used to increase hole mobility in a p-channel FET. On the other hand, salicidation of a palladium-containing gate metal layer typically results in volumetric expansion in the gate metal layer and forms a compressively stressed gate metal silicide layer, which can be used to create tensile stress in the channel region of an n-FET for increasing electron mobility therein.

In the following description, numerous specific details are set forth, such as particular structures, components, materials, dimensions, processing steps and techniques, in order to provide a thorough understanding of the present invention. However, it will be appreciated by those of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides a semiconductor device that comprises at least one FET with an intrinsically stressed gate metal silicide layer that is laterally confined by one or more gate sidewall spacers for creating desired stress in the channel region of the FET, so as to enhance mobility of the corresponding carriers in the FET channel region (i.e., electrons in the n-channel and holes in the p-channel).

The FET device structure of the present invention, as well as the method for fabricating the same, will now be described in greater detail by referring to the accompanying drawings in FIGS. 1A-1J. Note that in these drawings, which are not drawn to scale, like and/or corresponding elements are referred to by like reference numerals. It is further noted that in the drawings one p-channel FET and one n-channel FET are shown atop a single semiconductor substrate. Although illustration is made to such an embodiment, the present invention is not limited to the formation of any specific number of FET devices on the surface of the semiconductor structure.

Reference is first made to FIG. 1A, which shows a semiconductor substrate 12 containing one or more isolation regions 14 therein.

The semiconductor substrate 12 may comprise any semiconductor material including, but not limited to: Si, SiC, SiGe, SiGeC, Ge alloys, GaAs, InAs, InP, as well as other III-V or II-VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. The semiconductor substrate 12 may include a first doped (n- or p-) device region (not shown) for the n-FET, and a second doped (n- or p-) device region (not shown) for the p-FET. The first doped device region and the second doped device region may have the same or different conductivities and/or doping concentrations. The doped device regions are typically known as "wells".

At least one isolation region 14 is typically formed into the semiconductor substrate 12, to provide isolation between the doped device region for the n-FET and the doped device region for the p-FET. The isolation region 14 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

After forming the at least one isolation region 14 within the semiconductor substrate 12, a gate dielectric layer 16 is formed on the entire surface of the substrate 12. The gate dielectric layer 14 can be formed by a thermal growing process such as, for example, oxidation, nitridation or oxynitridation. Alternatively, the gate dielectric layer 16 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layer 16 may also be formed utilizing any combination of the above processes. The gate dielectric layer 16 is comprised of an insulating material including, but not limited to: an oxide, nitride, oxynitride and/or silicate including metal silicates and nitrided metal silicates. In one embodiment, it is preferred that the gate dielectric layer 16 is comprised of an oxide such as, for example, $SiO_2$, $HfO_2$. $ZrO_2$, $Al_2O_3$, $TiO_2$, $La_2O_3$, $SrTiO_3$, $LaAlO_3$, and mixtures thereof. The physical thickness of the gate dielectric layer 16 may vary, but typically, the gate dielectric layer 16 has a thickness from about 0.5 to about 10 nm, with a thickness from about 0.5 to about 3 nm being more typical.

After forming the gate dielectric layer 16, a gate conductor layer 18 is formed on the gate dielectric layer 16, utilizing a known deposition process such as, for example, physical vapor deposition, CVD or evaporation. The gate conductor layer 18 may comprise any suitable material, including, but not limited to: silicon, polysilicon, or a metal. Preferably, but not necessarily, the gate conductor layer 18 comprises polysilicon that may be either doped or undoped. The thickness, i.e., height, of the gate conductor layer 18 deposited at this point of the present invention may vary depending on the deposition process employed. Typically, the gate conductor layer 18 has a vertical thickness from about 20 to about 180 nm, with a thickness from about 40 to about 150 nm being more typical.

The gate dielectric layer 16 and the gate conductor layer 18 jointly form a gate stack, which may comprise additional structure layers, e.g., cap layers and/or diffusion barrier layers (not shown), as commonly included in MOS gate structures. After formation of the gate stack, a dielectric hard mask 20 is deposited thereon utilizing a deposition process such as, for example, physical vapor deposition (PVD), chemical vapor deposition (CVD), or tetraethylorthosilicate-based chemical vapor deposition (CVD TEOS). The dielectric hard mask 20 may be an oxide, nitride, oxynitride or any combination thereof. Preferably, the dielectric hard mask 20 comprises silicon oxide deposited by a tetraethylorthosilicate-based chemical vapor deposition process.

Figure 1B:
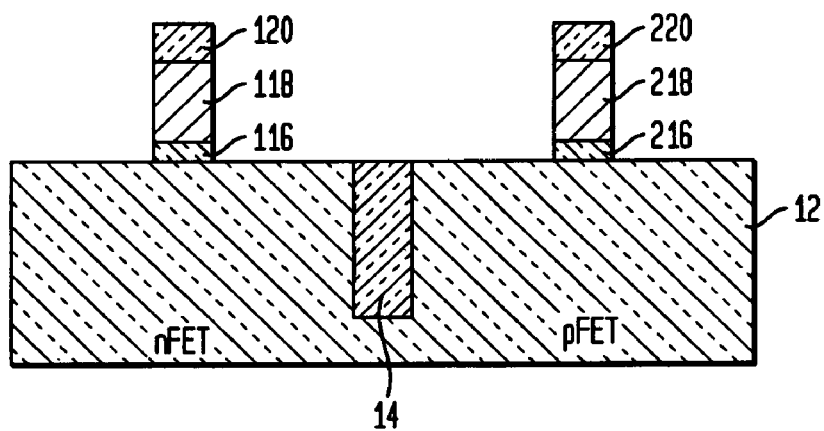
Figure 1C:
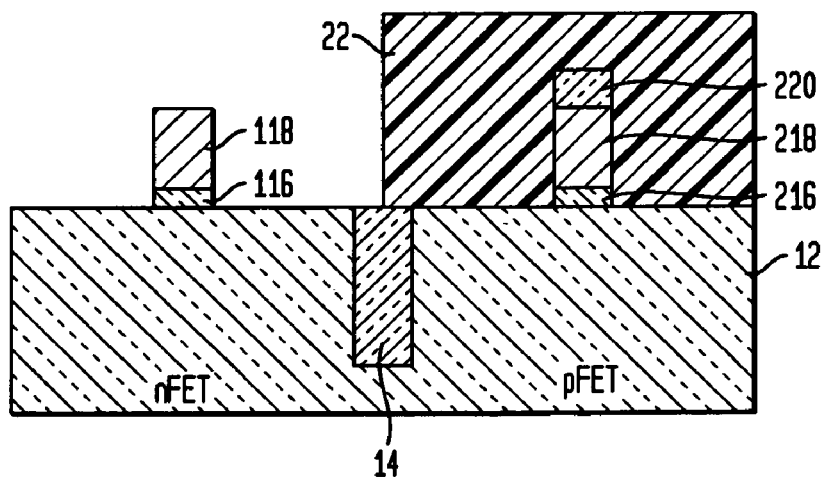

The gate dielectric layer 16, the gate conductor layer 18, and the dielectric hard mask 20 are then patterned by lithography and etching so as to provide two or more patterned gate stacks, one for the n-FET and one for the p-FET as shown in FIG. 1B. The patterned gate stack for the n-FET contains the gate dielectric layer 116 and the gate conductor or gate electrode 118 covered by a patterned dielectric hard mask 120, and the patterned gate stack for the p-FET contains the gate dielectric layer 216 and the gate electrode 218 covered by a patterned dielectric hard mask 220. The patterned gate stacks for the n-FET and the p-FET may have the same dimension, i.e., length, or they can have variable dimensions to improve device performance. The lithography step includes applying a photoresist (not shown) to the upper surface of the dielectric hard mask layer 20, exposing the photoresist to a desired pattern of radiation and developing the exposed photoresist utilizing a conventional resist developer. The pattern in the photoresist is then transferred to the dielectric mask layer 20, the gate conductor layer 18, and the gate dielectric layer 16, utilizing one or more dry etching steps, forming the patterned gate stacks. Suitable dry etching processes that can be used in the present invention in forming the patterned gate stacks include, but are not limited to: reactive ion etching (RIE), ion beam etching, plasma etching or laser ablation. The patterned photoresist is then removed after etching has been completed, exposing the patterned gate stacks.

Next, a patterned photoresist film 22 is selectively formed over the patterned gate stack for the p-FET. The area corresponding to the patterned gate stack for the n-FET and other necessary areas are exposed, so as to allow selective removal of the dielectric hard mask layer 120 from the patterned gate stack for the n-FET, as shown in Figure IC. The patterned photoresist film 22 is removed after the selective removal of the dielectric hard mask layer 120 from the n-FET gate stack.

Figure 1D:
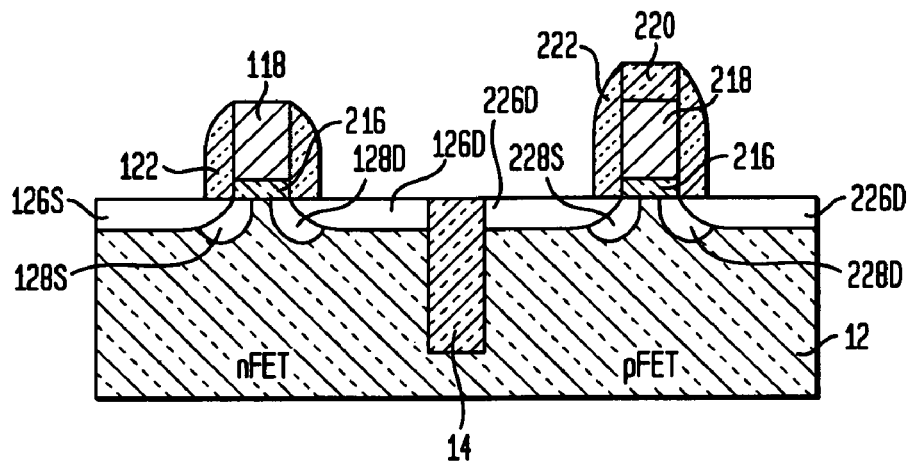

Next, a first set of sidewall gate spacers 122 and 222 are formed along exposed sidewalls of the n-FET and p-FET patterned gate stacks, followed by formation of n-FET and p-FET source/drain extension and halo implants 126S, 126D, 128S, 128D, 226S, 226D, 228S, and 228D, as shown in FIG. 1D.

The extension implants 126S, 126D, 226S, and 226D can be formed in a self-aligned manner by an ion implantation step, in which the n-FET and p-FET patterned gate stacks are used as implant masks. The extension implants 126S, 126D, 226S, and 226D are impurity layers of the same conductivity type as the main source/drain layers (to be formed subsequently) of the n-FET and the p-FET. The extension implants function as source/drain layers are thus referred to herein as source/drain extension implants. The source/drain extension implants 126S, 126D, 226S, and 226D may extend more than necessary under the patterned gate stacks, due to scattering of impurity ions during implantation and diffusion of impurity ions in a subsequent process.

Thereafter, source/drain pocket or halo implants 128S, 128D, 228S, and 228D can be formed by a halo implantation step, using the patterned gate stacks as implant masks. Preferably, but not necessarily, the halo implantation step is conducted at a predetermined inclined angle relative to the vertical direction. The halo implant species, energy level of the ion beam, and/or the duration of the ion beam exposure may be adjusted to achieve optimal implant level.

Figure 1E:
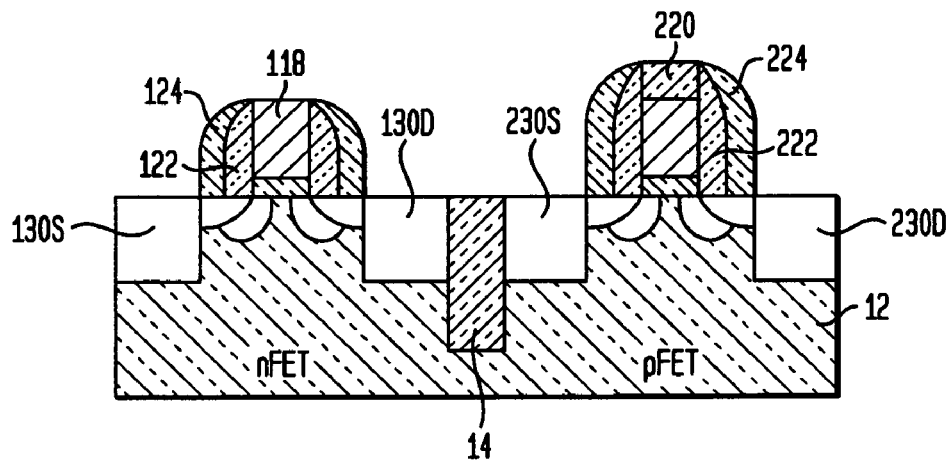

FIG. 1E shows subsequent formation of a second set of sidewall gate spacers 124 and 224 along the sidewalls of the n-FET and p-FET patterned gate stacks, respectively, by conventionally known processing steps, such as CVD and RIE. The sidewall gate spacers 124 and 224 can comprise any insulating material, such as silicon nitride, silicon dioxide, or silicon oxynitride.

Another ion implantation step can then be performed using the patterned gate stacks and the second set of sidewall gate spacers 124 and 224 as implant masks to form source and drain regions 130S, 130D, 230S, and 230D for the n-FET and the p-FET in a self-aligned manner, as shown in FIG. 1E. The source/drain regions 130S, 130D, 230S, and 230D can be subsequently annealed to activate the dopant species implanted therein. The conditions for the ion implantation and the annealing step are well known to those skilled in the art.

The source/drain regions 130S, 130D, 230S, and 230D may alternatively contain embedded epitaxial layers with intrinsic tensile or compressive stress, as described in U.S. Patent Application Publication No. 2005/0082616. It is known that epitaxial growth of a material layer on a substrate may impart intrinsic stress to such material layer, if the natural lattice constant of such a material layer is different from the base lattice constant of the substrate. For example, the natural lattice constant of carbon is smaller than that of silicon. Therefore, a Si:C layer epitaxially grown on a silicon substrate contains tensile stress due to tensile distortion of the Si:C crystal lattice. Similarly, the natural lattice constant of germanium is larger than that of silicon, so a SiGe layer epitaxially grown on a silicon substrate contains compressive stress due to compressive distortion of the SiGe crystal lattice.

U.S. Patent Application Publication No. 2005/0082616 specifically describes use of embedded Si:C or SiGe layers with tensile or compressive stress in the source/drain regions of n-FET or p-FET for providing tensile or compressive stress in the n-FET or p-FET channel. For example, the source and drain regions of a p-FET are first etched, and a highly compressive selective epitaxial SiGe layer is grown in the etched regions of the p-FET to apply compressive stress to the adjacent p-FET channel region. Subsequently, the source and drain regions of an n-FET are etched, and a highly tensile selective epitaxial Si:C layer is grown in the etched regions of the n-FET to apply tensile stress to the adjacent n-FET channel region. For more details, please see U.S. Patent Application Publication No. 2005/0082616, the content of which is hereby incorporated by reference in its entirety for all purposes.

Further, the source and drain regions 130S, 130D, 230S, and 230D may be formed in a "raised" manner. The process for fabricating raised source and drain regions is described in detail by various U.S. patents, including U.S. Pat. No. 6,420,766 issued on Jul. 16, 2002 and U.S. Pat. No. 6,914,303 issued on Jul. 5, 2005, the contents of which are hereby incorporated by reference in their entireties for all purposes.

Figure 1F:
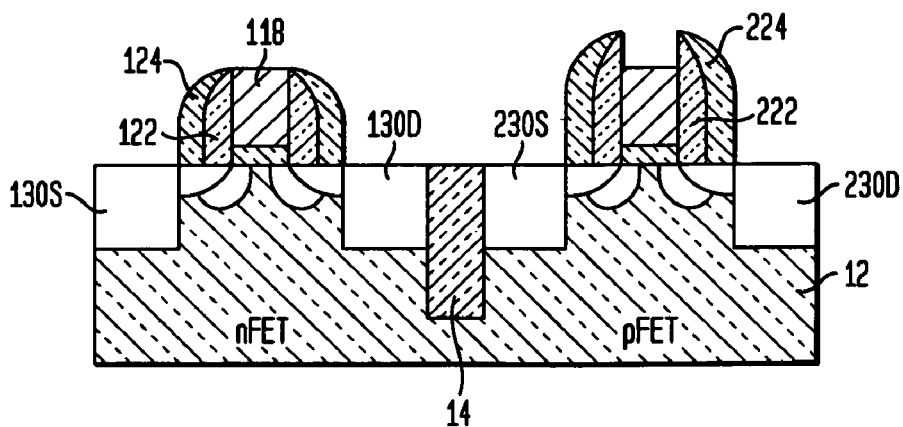

After formation of the source/drain regions 130S, 130D, 230S, and 230D, the dielectric hard mask layer 220 is removed from the p-FET patterned gate stack. In this manner, a n-FET gate stack with an "unrecessed" gate electrode 118 is formed, i.e., the gate electrode 118 has an upper surface that is substantially co-plannar with the gate sidewall spacers 122 and 124, while a p-FET gate stack with a "recessed" gate electrode 218 is formed, i.e., the gate electrode 218 has an upper surface that is recessed within the gate sidewall spacers 122 and 124, as shown in FIG. 1F.

Subsequently, a thin metal layer 24 (e.g., about 3-15 nm thick) is formed over the entire structure of FIG. 1F. The metal layer 24 may comprise any metal or metal alloy that is capable of reacting with silicon to form a metal silicide. Examples of such metals or metal alloys include, but are not limited to: Co, Ni, Pd, Ti, Ta, W, Pt, and alloys thereof. In one embodiment, Ni and Co is a preferred metal. In another embodiment, Pd is a preferred metal. The metal layer 24 may be deposited using any conventional deposition process including, for example, sputtering, chemical vapor deposition, evaporation, chemical solution deposition, plating and the like. If the semiconductor substrate 12 or the gate electrodes 118 and 218 does not comprise silicon, patterned silicon layers (not shown) can be grown over the source/drain regions and the gate electrodes of the n-FET and the p-FET before deposition of the metal layer 24 for subsequent formation of source/drain and gate metal silicide contacts.

Figure 1G:
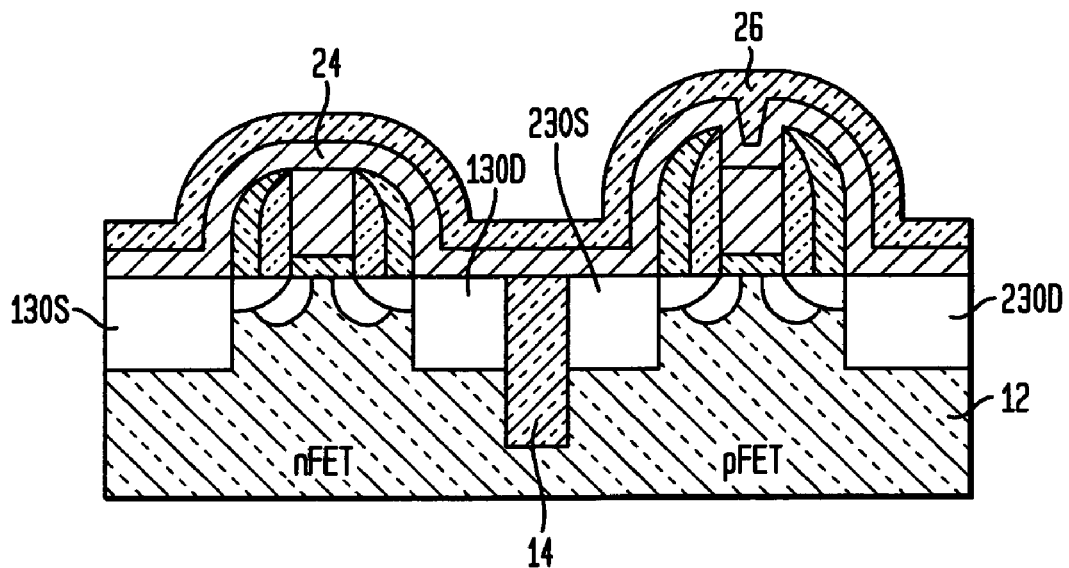

A first capping layer 26 is then formed over the metal layer 24, as shown in FIG. 1G. The first capping layer 26 preferably comprises a diffusion barrier material, such as TiN.

Figure 1H:
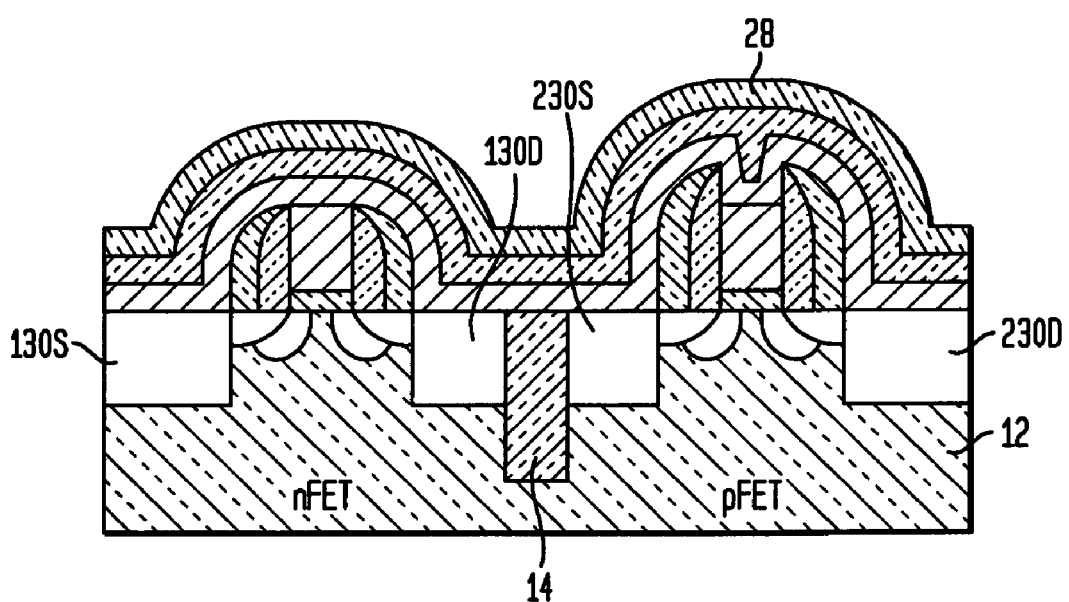

A second capping layer 28 is further formed over the first capping layer 26 to cover both the n-FET and the p-FET, as shown in FIG. 1H. Preferably, but not necessarily, the second capping layer 28 comprises a dielectric material, such as silicon nitride.

Figure 1I:
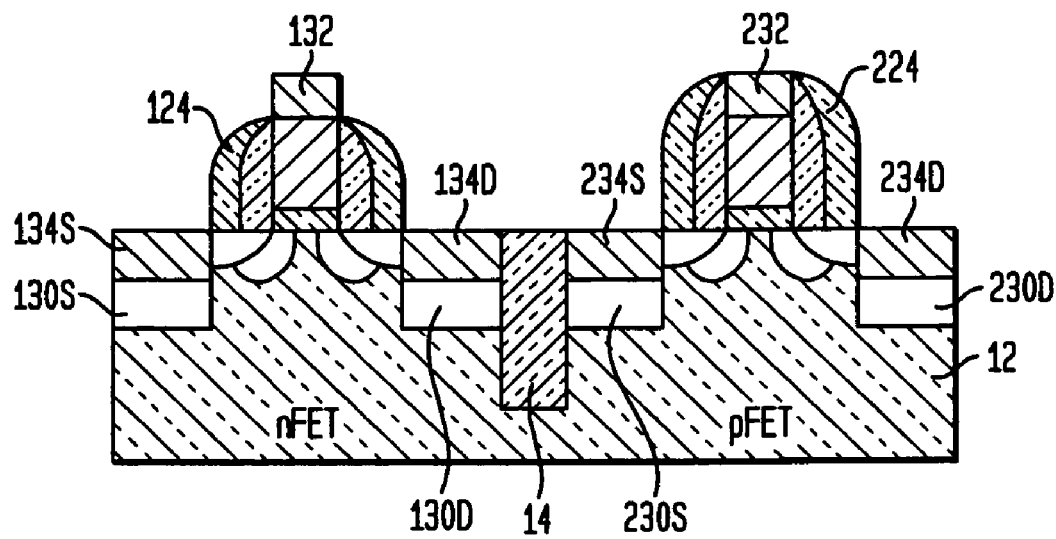

Next, an annealing step is carried out at an elevated annealing temperature for about 5-50 seconds, where the metal in the metal layer 24 reacts with exposed silicon in the gate electrodes 118 and 218 as well as in the source/drain regions 130S, 130D, 230S, and 230D, to form gate and source/drain metal silicide contacts 132, 232, 134S, 134D, 234S, and 234D, as shown in FIG. 1I. The annealing temperature may range from about 350° C. to about 550° C., depending on the specific type of metal contained in the metal layer 24. For example, for cobalt, the annealing temperature is preferably from about 450° C. to about 550° C.; for nickel, the annealing temperature is preferably from about 350° C. to about 450° C. After annealing, the first and second capping layers 26 and 28 as well as unreacted metal in other regions are removed from the n-FET and the p-FET.

Typically, formation of metal silicides, such as $CoSi_x$ or $NiSi_x$, result in volumetric reduction, causing high tensile stress in such metal silicides. When a single Co- or Ni-containing metal layer is used for forming the metal silicide contacts in both the n-FET and the p-FET, tensilely stressed gate metal silicide layers will be formed, which, if confined by the sidewall spacers, will transfer stress to the underlying channel layers and create an opposite, compressive stress in the channel layers.

The compressive stress is known for enhancing hole mobility (which leads to enhanced p-FET performance) but decreasing electron mobility (which leads to reduced n-FET performance). Therefore, when a single Co- or Ni-containing metal layer is used, it is preferred that the p-FET gate metal silicide 232 is laterally confined by the gate sidewall spacers 222 and 224, as shown in FIG. 1I, so that it can effectively transfer stress to the underlying channel layer of the p-FET, for creation of an opposite, compressive stress in the underlying p-channel, which enhances hole mobility in the p-channel. For the n-FET, however, it is preferred that the metal silicide 132 protrudes above, and is not laterally confined by, the gate sidewall spacers 122 and 124, so that little or no compressive stress was created in the underlying channel layer of the n-FET.

On the other hand, certain metal silicides, such as $PdSi_x$, can be formed with volumetric expansion, which leads to high intrinsic compressive stress. It is therefore desirable to use different metal layers for forming metal silicide contacts in the n-FET and the p-FET. For example, a patterned Pd-containing metal layer (not shown) can be formed to selectively cover the n-FET, while a patterned Co- or Ni-containing metal layer (not shown) can be formed to selectively cover the p-FET, for formation of a compressively stressed gate metal silicide layer for the n-FET and a tensilely stressed gate metal silicide for the p-FET. In such a manner, both the n-FET gate metal silicide layer and the p-FET gate metal silicide layer can be laterally confined by the gate side wall spacers for effective creation of desired stresses in the underlying channel layers of the n-FET and the p-FET.

Figure 1J:
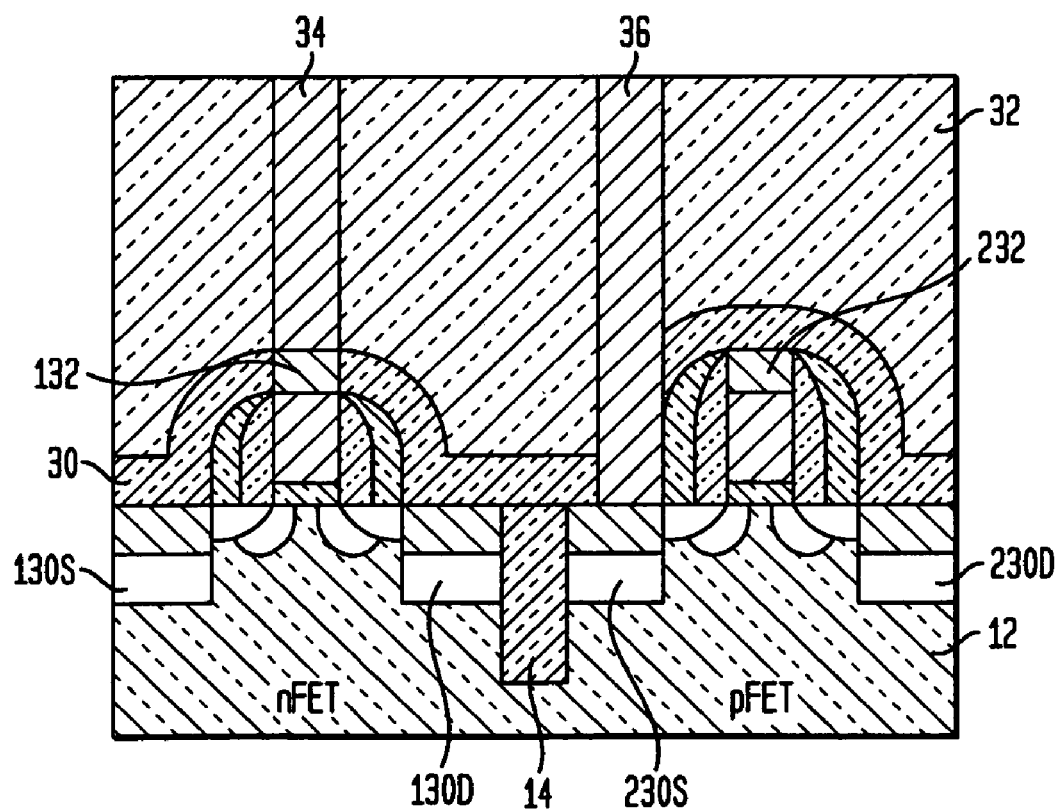

FIG. 1J shows subsequent formation of an etch-stop/stress-inducing cap layer 30 over the entire structure of FIG. 1I. The etch-stop/stress-inducing cap layer 30 may comprise any suitable insulating material, including but not limited to: an oxide, nitride, oxynitride and/or silicate including a metal silicate and a nitrided metal silicate. It is preferred that the etch-stop/stress-inducing cap layer 30 comprises a nitride or an oxynitride insulating material, such as silicon nitride or silicon oxynitride, which is intrinsically stressed and is arranged and constructed for applying desired stress to the channel regions of the n-FET and the p-FET. Such an etch-stop/stress-inducing cap 30 can be formed by various dielectric deposition techniques, such as, for example, low pressure chemical vapor deposition (LPCVD), plasma-enhanced chemical vapor deposition (PECVD), or high-density plasma chemical vapor deposition (HDP CVD), or any other process commonly used for dielectric deposition.

Subsequently, conventional back-end-of-line processing steps can be carried out to form a complete semiconductor device containing both the n-FET and the p-FET with inter-level dielectric (ILD) 32 and metal contacts 34 and 36, as shown in FIG. 1J. The ILD 32 may contain a dielectric oxide material or a low dielectric constant insulating material. The processes for fabricating the ILD 32 and the metal contacts 34 and 36 are known in the art and are therefore not described herein in detail.

It is important to note that the processing steps as shown in FIGS. 1A-1J can readily be modified by a person ordinarily skilled in the art, consistent with the description provided hereinabove, and such modifications are to be regarded as being within the spirit and scope of the invention.

Figure 2:
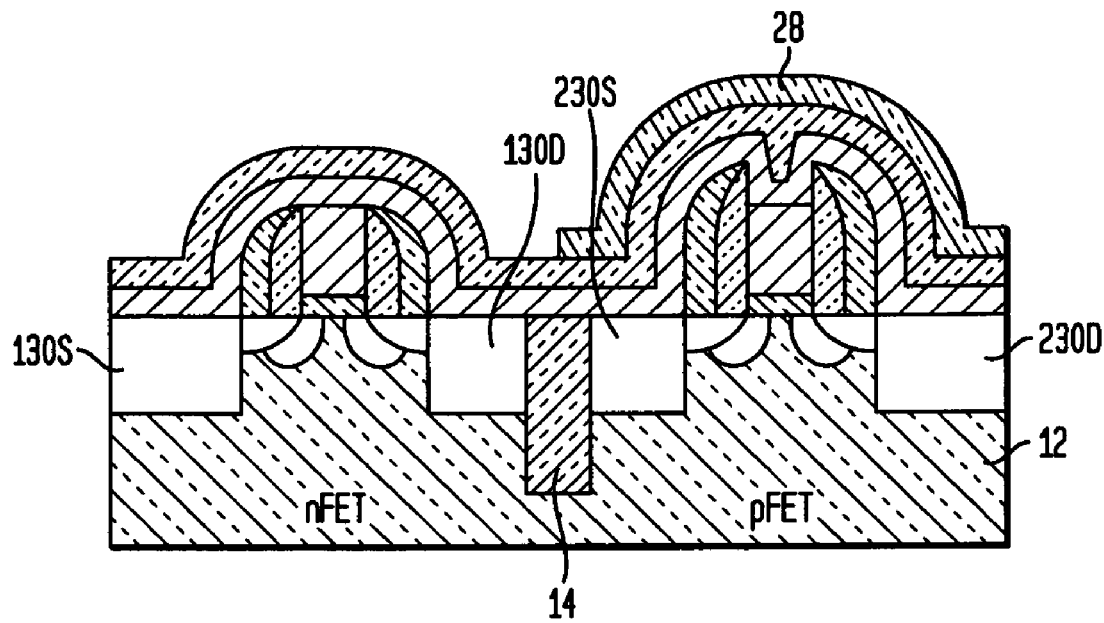
FIG. 2 illustrates an alternative processing step for forming the semiconductor device structure of FIG. 1J, according to one embodiment of the present invention.

For example, the second capping layer 28, which preferably comprises $Si_3N_4$, can be patterned to selectively cover the p-FET, as shown in FIG. 2. In this manner, during the subsequent annealing step, the second capping layer 28 selectively confines volumetric change in the gate metal silicide layer 232 of the p-FET, thereby creating intrinsic stress in the p-FET gate metal silicide layer 232. After formation of the intrinsically stressed p-FET gate metal silicide layer 232, the unreacted metal, the first capping layer 26, and the patterned second capping layer 28 can be removed to form the device structure shown in FIG. 1I, which can be subsequently processed by the conventional back-end-of-line processing steps as described hereinabove.

Figure 3:
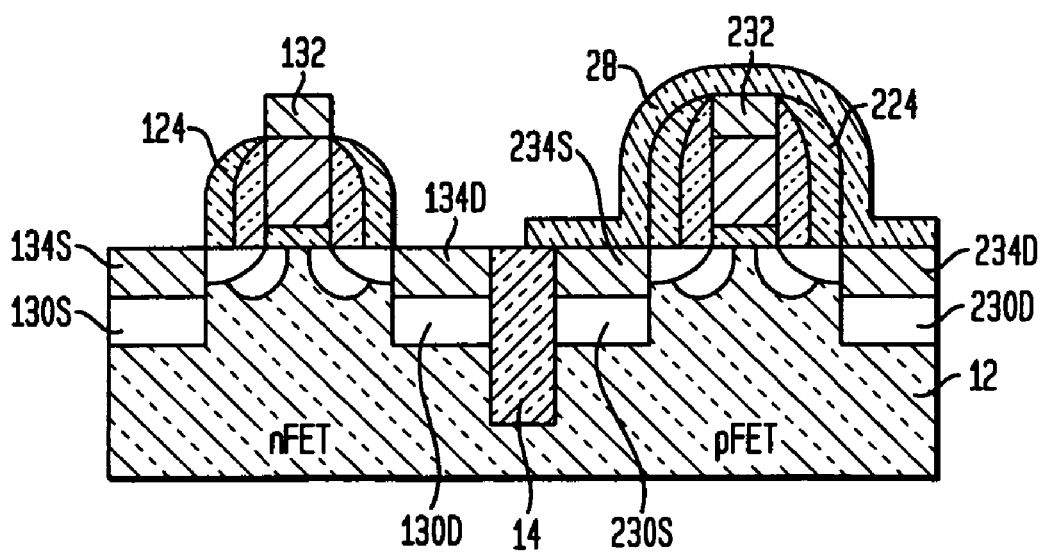
FIG. 3 illustrates a further alternative processing step for forming the semiconductor device structure of FIG. 1J, according to one embodiment of the present invention.

For another example, the metal layer 24 may comprise a metal, such as Co or Ti, which can be used to form metal silicides such as $CoSi_2$ or $TiSi_2$ by a two-step annealing process. Specifically, after deposition of the metal layer 24 and the first capping layer 26, a first annealing step is employed to form a metal silicide of a first silicide phase (e.g., CoSi or TiSi) of higher resistivity. Next, the first capping layer 26 and the unreacted metal are removed from the device structure, followed by deposition of a patterned second capping layer 28, which selectively covers the p-FET, as shown in FIG. 3. A second annealing step is subsequently carried out at a different annealing temperature to consume the remaining polysilicon and to convert the metal silicide from the first silicide phase to a second silicide phase (e.g., $CoSi_2$ or $TiSi_2$) of lower resistivity. During such a second annealing step, the patterned second capping layer 28 selectively confines volumetric change in the p-FET gate metal silicide layer 232, thereby creating intrinsic stress in the p-FET gate metal silicide layer 232. After formation of the intrinsically stressed p-FET gate metal silicide layer 232, the patterned second capping layer 28 can be removed to form the device structure shown in FIG. 1I, which can be subsequently processed by the conventional back-end-of-line processing steps as described hereinabove.

Figure 4A:
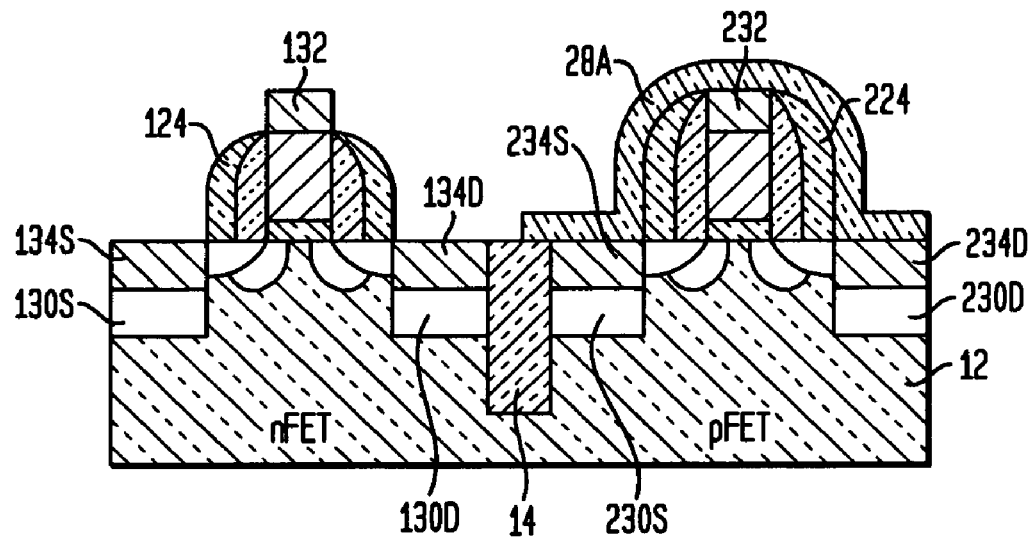
FIGS. 4A and 4B illustrate the processing steps for forming an exemplary semiconductor device structure containing a p-FET that has a "recessed" gate metal silicide layer and is covered by a compressively stressed capping layer and an n-FET that has an "unrecessed" gate metal silicide layer and is covered by a tensilely stressed capping layer, according to one embodiment of the present invention.
Figure 4B:
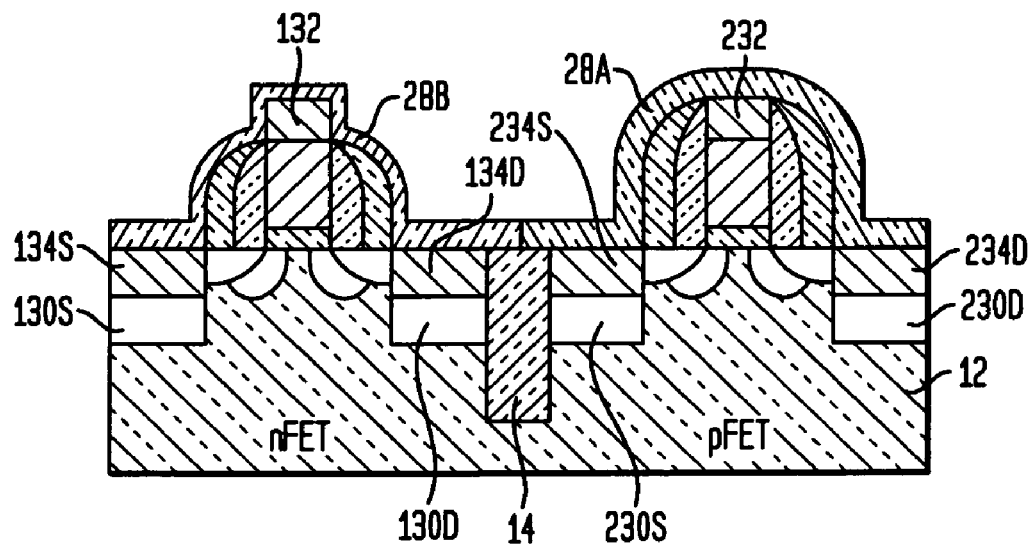

For a further example, a patterned second capping layer 28A, which contains intrinsic, compressive stress, as shown in FIG. 4A, can be provided to selectively cover the p-FET after the first annealing step, but before the second annealing step. During the second annealing step, such a compressively stressed capping layer 28A not only selectively confines volumetric change in the p-FET gate metal silicide layer 232, but also applies tensile stress to the layer 232, thereby significantly increasing the tensile stress formed in the p-FET gate metal silicide layer 232. The compressively stressed capping layer 28A can be retained in the device structure after formation of the p-FET gate metal silicide layer 232, so that it continues to create tensile stress in the p-FET gate metal silicide layer 232, which in turn creates desired compressive stress in the underlying channel region of the p-FET. Preferably but not necessarily, a tensilely stressed capping layer 28B can be further formed side-by-side with the compressively stressed capping layer 28A, to selectively cover the n-FET, as shown in FIG. 4B. The tensilely stressed capping layer 28B functions to create compressive stress in the n-FET gate metal silicide layer 132, which in turn creates desired tensile stress in the underlying channel region of the n-FET.

Moreover, the structures and processing steps of the present invention as described hereinabove can be readily used in conjugation with any other well-known materials, structures, or processing steps that can cause enhanced mobility in the channel region of the FET device. For example, a stressed liner that is formed about the gate stack, raised source/drain regions, embedded well regions, and/or embedded and stressed source/drain regions containing Si:C and/or SiGe, can be used with the present invention. It should be noted that although these structures or features are not specifically illustrated herein, they can be readily incorporated into the present invention, either separately or in combination, by a person ordinarily skilled in the art consistent with the descriptions provided herein.

The methods of the present invention can be widely used for fabricating various semiconductor device structures, including, but not limited to, complementary metal-oxide-semiconductor (CMOS) transistors, as well as integrated circuit, microprocessors and other electronic devices comprising such CMOS transistors, which are well known to those skilled in the art and can be readily modified to incorporate the strained semiconductor-on-insulator structure of the present invention, and therefore details concerning their fabrication are not provided herein.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for fabricating a semiconductor device, comprising:
   forming at least one p-FET precursor structure with a recessed gate electrode and at least one n-FET precursor structure with an un-recessed gate electrode;
   depositing a metal layer over said at least one p-FET and said at least one n-FET precursor structures;
   depositing a first and a second capping layers over said metal layer;
   annealing said at least one p-FET and said at least one n-FET precursor structures at an elevated temperature to form a first metal silicide layer in a surface of the recessed gate electrode of the at least one p-FET precursor structure, and a second metal silicide layer in a surface of the unrecessed gate electrode of the at least one n-FET precursor structure; and
   removing unreacted metal, the first capping layer, and the second capping layer from the at least one p-FET and the at least one n-FET precursor structures to form at least one p-FET and at least one n-FET, wherein said first metal silicide layer of said at least one p-FET is intrinsically stressed and is laterally confined by gate spacers and is arranged and constructed for creating compressive stress in a channel region of the at least one p-FET, and said second metal silicide of said at least one n-FET protrudes above one or more gate sidewall spacers.

2. A method for fabricating a semiconductor device, comprising:
providing at least one p-FET with a recessed gate electrode and at least one n-FET with an un-recessed gate electrode;
depositing a metal layer over said at least one p-FET and said at least one n-FET;
depositing a first capping layer over said metal layer to cover both the at least one p-FET and the at least one n-FET;
forming a patterned second capping layer over the first capping layer to selectively cover the at least one p-FET;
annealing said at least one p-FET and said at least one n-FET at an elevated temperature to form a first metal silicide layer in a surface of the recessed gate electrode of the at least one p-FET, and a second metal silicide layer in a surface of the unrecessed gate electrode of the at least one n-FET; and
removing unreacted metal, the first capping layer, and the patterned second capping layer from the at least one p-FET and the at least one n-FET, wherein said first metal silicide layer of said at least one p-FET is intrinsically stressed and is laterally confined by gate spacers and is arranged and constructed for creating compressive stress in a channel region of the at least one p-FET, and said second metal silicide of said at least one n-FET protrudes above one or more gate sidewall spacers.

3. A method for fabricating a semiconductor device, comprising:
providing at least one p-FET precursor structure with a recessed gate electrode and at least one n-FET precursor structure with an unrecessed gate electrode;
depositing a metal layer over said at least one p-FET and said at least one n-FET precursor structures and a first capping layer over said metal layer to cover both the at least one p-FET and the at least one n-FET precursor structures;
annealing said at least one p-FET and at least one n-FET precursor structures at a first elevated temperature to form a first metal silicide layer in a surface of the recessed gate electrode of the at least one p-FET precursor structure, and a second metal silicide layer in a surface of the unrecessed gate electrode of the at least one n-FET precursor structure, wherein said first and second metal silicide layers have a first silicide phase;
removing unreacted metal and the first capping layer from said at least one p-FET and the at least one n-FET precursor structures;
forming a patterned second capping layer to selectively cover said at least one p-FET precursor structure;
annealing said at least one p-FET and at least one n-FET precursor structures at a second elevated temperature, so as to convert the first and second metal silicide layers from the first silicide phase into a second, different silicide phase; and
removing the patterned second capping layer to form at least one p-FET and at least one n-FET, wherein said first metal silicide layer of said at least one p-FET is intrinsically stressed and is laterally confined by gate spacers and is arranged and constructed for creating compressive stress in a channel region of the at least one p-FET, and said second metal silicide of said at least one n-FET protrudes above one or more gate sidewall spacers.

4. A method for fabricating a semiconductor device, comprising:
providing at least one p-FET precursor structure with a recessed gate electrode and at least one n-FET precursor structure with an unrecessed gate electrode;
depositing a metal layer over said at least one p-FET and said at least one n-FET precursor structures and a first capping layer over said metal layer to cover both the at least one p-FET and the at least one n-FET precursor structures;
annealing said at least one p-FET and said at least one n-FET precursor structures at a first elevated temperature to form a first metal silicide layer in a surface of the recessed gate electrode of the at least one p-FET precursor structure, and a second metal silicide layer in a surface of the unrecessed gate electrode of the at least one n-FET precursor structure, wherein said first and second metal silicide layers have a first silicide phase;
removing unreacted metal and the first capping layer from said at least one p-FET and said at least one n-FET precursor structures;
forming a patterned second capping layer to selectively cover said at least one p-FET precursor structure, wherein said patterned second capping layer is compressively stressed;
annealing said at least one p-FET and said at least one n-FET precursor structures at a second elevated temperature, so as to convert the first and second metal silicide layers from the first silicide phase into a second, different silicide phase; and
forming a patterned third capping layer to selectively cover the said at least one n-FET precursor structure, wherein said patterned third capping layer is tensilely stressed, forming at least one p-FET and at least one n-FET, wherein said first metal silicide layer of said at least one p-FET is intrinsically stressed and is laterally confined by gate spacers and is arranged and constructed for creating compressive stress in a channel region of the at least one p-FET, and said second metal silicide of said at least one n-FET protrudes above one or more gate sidewall spacers.

* * * * *